United States Patent
Thomsen

(10) Patent No.: US 9,900,707 B1
(45) Date of Patent: Feb. 20, 2018

(54) BIASING OF ELECTROMECHANICAL SYSTEMS MICROPHONE WITH ALTERNATING-CURRENT VOLTAGE WAVEFORM

(71) Applicant: Cirrus Logic International Semiconductor Ltd., Edinburgh (GB)

(72) Inventor: Axel Thomsen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/363,798

(22) Filed: Nov. 29, 2016

(51) Int. Cl.
| | |
|---|---|
| H04R 29/00 | (2006.01) |
| H04R 19/04 | (2006.01) |
| H04R 7/04 | (2006.01) |
| H03G 3/30 | (2006.01) |

(52) U.S. Cl.
CPC ........... H04R 19/04 (2013.01); H03G 3/3005 (2013.01); H04R 7/04 (2013.01); H04R 29/004 (2013.01); H04R 2201/003 (2013.01)

(58) Field of Classification Search
CPC .... H04R 19/04; H04R 19/005; H04R 29/004; H04R 2201/003
USPC .......................................... 381/58, 174, 175
See application file for complete search history.

(56) References Cited

U.S. PATENT DOCUMENTS

| | | | |
|---|---|---|---|
| 8,363,860 B2 | 1/2013 | Zhang | |
| 8,755,541 B2 | 6/2014 | Liu | |
| 8,847,289 B2 | 9/2014 | Wang | |
| 8,934,649 B1 | 1/2015 | Lee et al. | |
| 2002/0093038 A1* | 7/2002 | Ikeda | H04R 19/00 257/213 |
| 2008/0170742 A1* | 7/2008 | Trusov | G01C 19/5719 381/396 |
| 2009/0095081 A1* | 4/2009 | Nakatani | G01P 15/125 73/514.32 |

(Continued)

FOREIGN PATENT DOCUMENTS

| | | |
|---|---|---|
| GB | 2467777 A | 8/2010 |
| JP | 2004328076 A | 11/2004 |
| WO | 2012020601 A1 | 2/2012 |

OTHER PUBLICATIONS

Search Report under Section 17, Application No. GB1700372.4, dated Feb. 23, 2017.

(Continued)

*Primary Examiner* — Katherine Faley
(74) *Attorney, Agent, or Firm* — Jackson Walker L.L.P.

(57) ABSTRACT

A MEMS microphone may include a backplate comprising first and second electrodes electrically isolated from one another and mechanically coupled to the backplate in a fixed relationship relative to the backplate and a diaphragm configured to displace relative to the backplate as a function of sound pressure incident upon the diaphragm, the diaphragm comprising third and fourth electrodes electrically isolated from one another and mechanically coupled to the diaphragm in a fixed relationship relative to the diaphragm such that the third and fourth electrodes displace relative to the backplate as a function of sound pressure incident upon the diaphragm. The first and third electrodes may form a first capacitor and the second and fourth electrodes may form a second capacitor, the capacitance of each which may be a function of the displacement of the diaphragm, and each of which may be biased by an alternating-current voltage waveform.

18 Claims, 2 Drawing Sheets

(56) References Cited

U.S. PATENT DOCUMENTS

| | | | |
|---|---|---|---|
| 2013/0241345 A1* | 9/2013 | Takezaki | A61B 8/4483 |
| | | | 310/300 |
| 2015/0002982 A1 | 1/2015 | Cazzaniga et al. | |
| 2015/0163594 A1* | 6/2015 | Andersen | H04R 3/04 |
| | | | 381/98 |
| 2015/0318829 A1* | 11/2015 | Astgimath | H03F 3/187 |
| | | | 381/120 |
| 2016/0347605 A1 | 12/2016 | Thompson et al. | |

OTHER PUBLICATIONS

Search Report under Section 17, Application No. GB1700376.5, dated Feb. 24, 2017.

\* cited by examiner

BIASING OF ELECTROMECHANICAL SYSTEMS MICROPHONE WITH ALTERNATING-CURRENT VOLTAGE WAVEFORM

RELATED APPLICATIONS

The present disclosure is related to U.S. Provisional Patent Application Ser. No. 62/438,144, filed Dec. 22, 2016, which is incorporated by reference herein in its entirety.

FIELD OF DISCLOSURE

The present disclosure relates in general to audio systems, and more particularly, to improving the performance of microelectromechanical systems (MEMS) based transducers as compared to traditional approaches.

BACKGROUND

Microphones are ubiquitous on many devices used by individuals, including computers, tablets, smart phones, and many other consumer devices. Generally speaking, a microphone is an electroacoustic transducer that produces an electrical signal in response to deflection of a portion (e.g., a membrane or other structure) of a microphone caused by sound incident upon the microphone. For example, a microphone may be implemented as a MEMS transducer. A MEMS transducer may include a diaphragm or membrane having an electrical capacitance to a reference plane or backplate, such that a change in acoustic pressure applied to the MEMS transducer causes a deflection or other movement of the membrane, and thus causes a change in the electrical capacitance. Such electrical capacitance or the change thereof may be sensed by a sensing circuit and processed.

Existing MEMS microphone implementations are susceptible to a variety of electronic noise sources that may negatively affect a signal-to-noise ratio of a MEMS microphone. Among such noise sources are flicker noise (also known as 1/f noise) and noise bias resistors used in the biasing topology of existing approaches. Also, as with any audio system, it may be desirable to improve dynamic range of MEMS microphone implementations compared to that of existing implementations.

SUMMARY

In accordance with the teachings of the present disclosure, certain disadvantages and problems associated with existing MEMS transducers may be reduced or eliminated.

In accordance with embodiments of the present disclosure, a microelectromechanical systems microphone may include a backplate comprising a first plurality of electrodes comprising at least a first electrode and a second electrode electrically isolated from one another and each are mechanically coupled to the backplate in a fixed relationship relative to the backplate, and a diaphragm configured to mechanically displace relative to the backplate as a function of sound pressure incident upon the diaphragm, wherein the diaphragm comprises a second plurality of electrodes, the second plurality of electrodes comprising at least a third electrode and a fourth electrode, wherein the third electrode and the fourth electrode are electrically isolated from one another and each is mechanically coupled to the diaphragm in a fixed relationship relative to the diaphragm such that the second plurality of electrodes mechanically displace relative to the backplate as the function of sound pressure incident upon the diaphragm. The first electrode and the third electrode may form a first capacitor having a first capacitance which is a function of a displacement of the diaphragm relative to the backplate. The second electrode and the fourth electrode may form a second capacitor having a second capacitance which is a function of the displacement of the diaphragm relative to the backplate. Each of the first capacitor and the second capacitor may be biased by an alternating-current voltage waveform.

In accordance with these and other embodiments of the present disclosure, a method may include biasing a first capacitor of an electromechanical systems microphone with an alternating-current voltage waveform and biasing a second capacitor of the electromechanical systems microphone with the alternating-current voltage waveform. The first capacitor may be formed from a first electrode and a third electrode and the second capacitor may be formed from a second electrode and a fourth electrode. The first electrode and the second electrode may be electrically isolated from one another and may each be mechanically coupled to a backplate in a fixed relationship relative to the backplate, the backplate comprising a first plurality of electrodes comprising the first electrode and the second electrode. The third electrode and the fourth electrode may be electrically isolated from one another and may each be mechanically coupled to a diaphragm in a fixed relationship relative to the diaphragm such that the second plurality of electrodes mechanically displace relative to the backplate as the function of sound pressure incident upon the diaphragm which mechanically displaces the diaphragm relative to the backplate. The first capacitor may have a first capacitance which is a function of a displacement of the diaphragm relative to the backplate and the second capacitor may have a second capacitance which is a function of a displacement of the diaphragm relative to the backplate.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
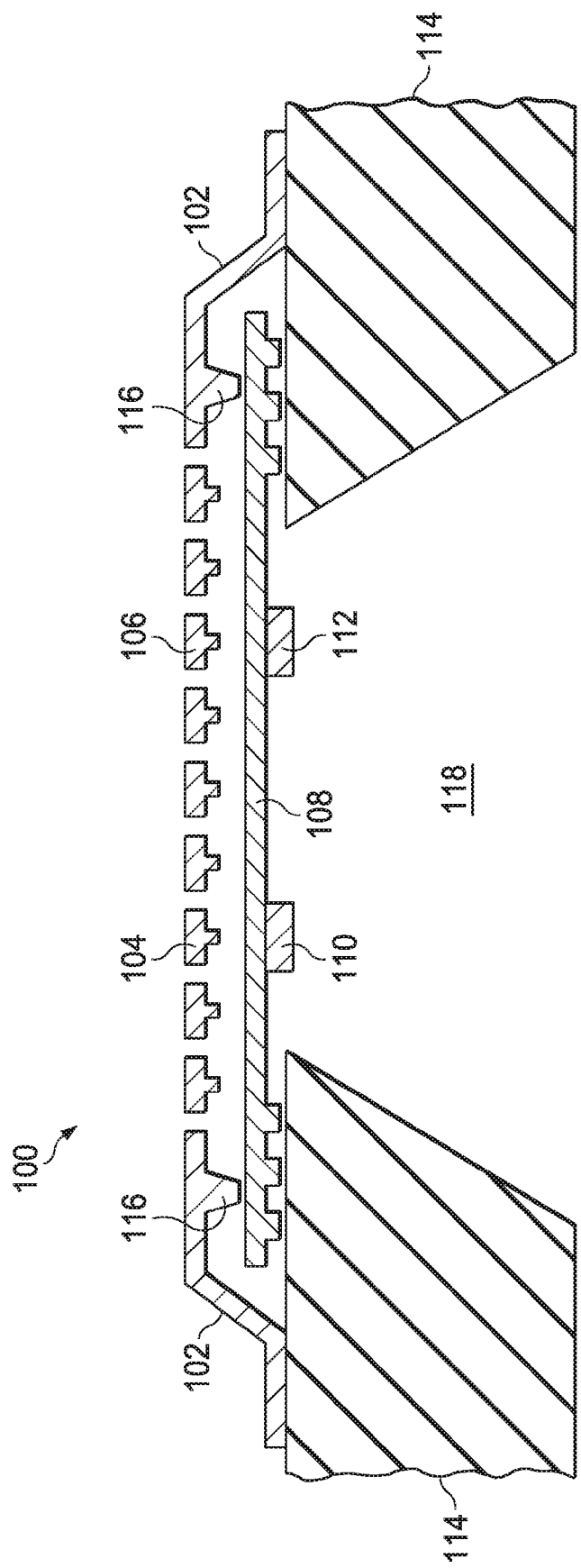
FIG. 1 illustrates a block diagram of selected components of an example MEMS microphone, in accordance with embodiments of the present disclosure.

FIG. 1 illustrates a block diagram of selected components of an example MEMS microphone 100, in accordance with embodiments of the present disclosure. As shown in FIG. 1, MEMS microphone 100 may comprise a backplate 102, a diaphragm 108, and a substrate 114.

Backplate 102 may include a plurality of electrodes comprising at least a first electrode 104 and a second electrode 106 electrically isolated from one another and each mechanically coupled to backplate 102 in a fixed relationship relative to backplate 102. For the purposes of clarity and exposition, only two electrodes 104 and 106 are depicted in FIG. 1. In some embodiments, backplate 102 may include more than two electrodes.

Diaphragm 108 may comprise a membrane or other structure configured to mechanically displace relative to the backplate as a function of sound pressure incident upon diaphragm (e.g., through acoustic port 118 of substrate 114). As shown in FIG. 1, backplate 102 may be mechanically coupled to diaphragm 108 via a plurality of support posts 116 of backplate 102. Diaphragm 108 may include a plurality of electrodes comprising at least a third electrode 110 and a fourth electrode 112, in which third electrode 110 and fourth electrode 112 are electrically isolated from one another and each is mechanically coupled to diaphragm 108 in a fixed relationship relative to diaphragm 108 such that electrodes 110 and 112 mechanically displace relative to backplate 102 as the function of sound pressure incident upon diaphragm 108.

Substrate 114 may comprise any suitable substrate or surface (e.g., a semiconductor substrate) upon which MEMS microphone 100 may be fabricated. The various components of MEMS microphone 100 (e.g., backplate 102, electrode 104, electrode 106, diaphragm 108, electrode 110, electrode 112, support posts 116, etc.) may be formed on substrate using semiconductor fabrication techniques now known or semiconductor fabrication techniques that may be known in the future. As also shown in FIG. 1, substrate 114 may also have an acoustic port 118 formed therein (e.g., using semiconductor fabrication techniques now known or semiconductor fabrication techniques that may be known in the future) through which sound pressure may propagate to diaphragm 108 to displace diaphragm 108 as a function of such sound pressure.

MEMS microphone 100 may be constructed such that first electrode 104 and third electrode 110 electrically interact with one another so as to form a first capacitor having a first capacitance which is a function of a displacement of diaphragm 108 relative to backplate 102. Similarly, MEMS microphone 100 may be constructed such that second electrode 106 and fourth electrode 112 electrically interact with one another so as to form a second capacitor having a second capacitance which is a function of a displacement of diaphragm 108 relative to backplate 102.

The implementation shown in FIG. 1 may be one of many ways to construct a MEMS microphone in accordance with the present disclosure. Accordingly, one or more other implementations may exist for a MEMS microphone which are substantially equivalent to that of MEMS microphone 100 depicted in FIG. 1.

Figure 2:
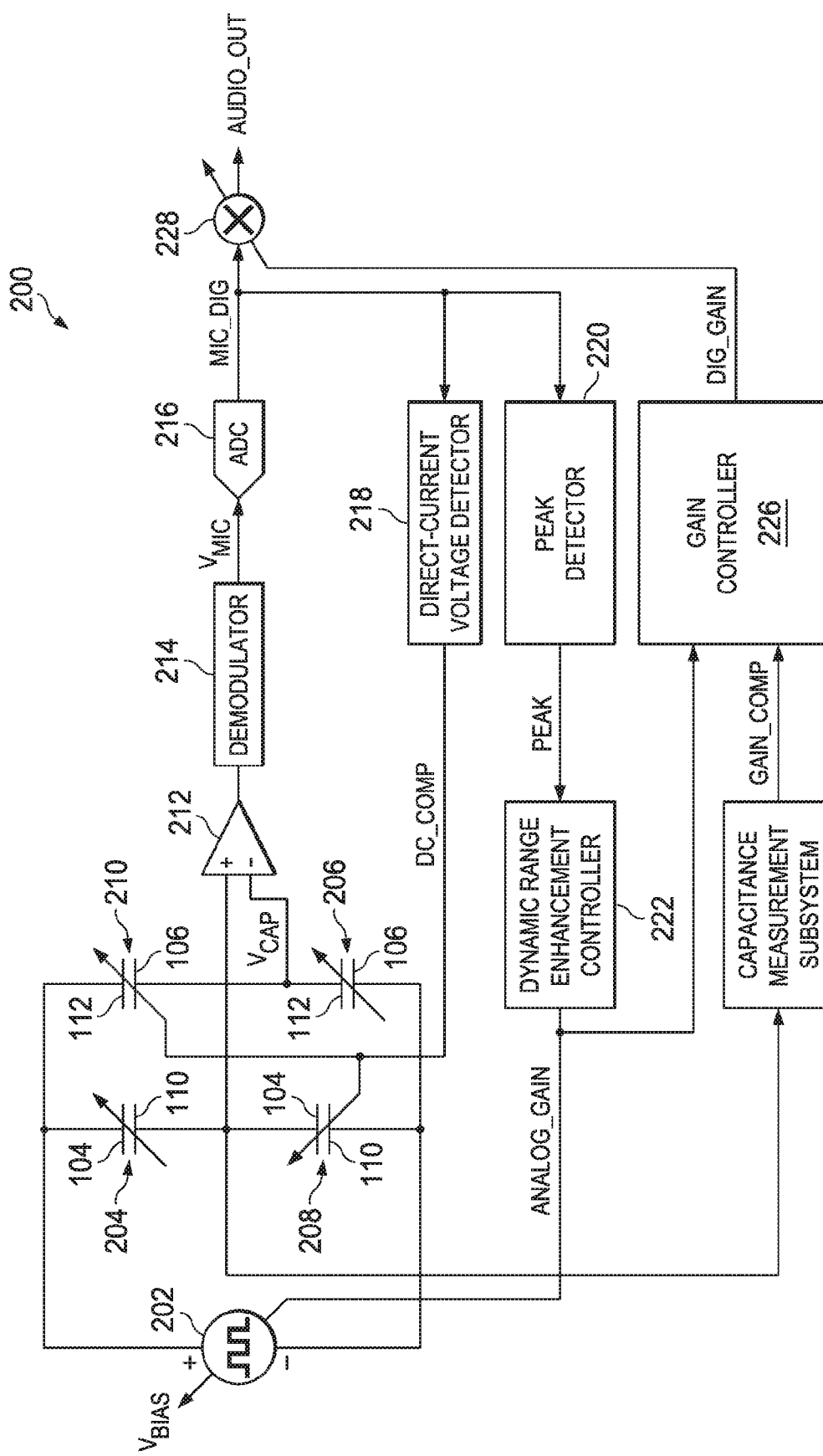
FIG. 2 illustrates a block diagram of selected components of an example audio system comprising a MEMS microphone biased with an alternating-current voltage waveform, in accordance with embodiments of the present disclosure.

FIG. 2 illustrates a block diagram of selected components of an example audio system 200 comprising a MEMS microphone biased with an alternating-current voltage waveform, in accordance with embodiments of the present disclosure. As shown in FIG. 2, audio system 200 may comprise a voltage supply 202, first capacitor 204 formed from first electrode 104 and third electrode 110, second capacitor 206 formed from second electrode 106 and fourth electrode 112, a third capacitor 208, a fourth capacitor 210, an amplifier 212, a demodulator 214, an analog-to-digital converter (ADC) 216, a direct-current voltage detector 218, a peak detector 220, a dynamic range enhancement controller 222, a capacitance measurement subsystem 224, a gain controller 226, and a gain element 228.

Voltage supply 202 may comprise any suitable system, device, or apparatus configured to output an alternating-current (AC) bias voltage $V_{BIAS}$ for biasing first capacitor 204 and second capacitor 206, as described in greater detail below. In some embodiments, voltage supply 202 may generate AC bias voltage $V_{BIAS}$ as a square-wave voltage waveform. However, any suitable AC waveform may be used. Voltage supply 202 may be implemented in any suitable manner, including without limitation with a charge pump power supply. In some embodiments, AC bias voltage $V_{BIAS}$ may have a frequency greater than that of human hearing (e.g., greater than 20 kilohertz).

As shown in FIG. 2, first electrode 104 of first capacitor 204 may be electrically coupled to a first terminal of voltage supply 202 and second electrode 106 of second capacitor 206 may be electrically coupled to a second terminal of voltage supply 202. Accordingly, each of first capacitor 204 and second capacitor 206 may be biased by the alternating-current voltage waveform generated by voltage supply 202. Furthermore, as shown in FIG. 2, first capacitor 204 and second capacitor 206 may be electrically coupled to one another in a bridge structure, the bridge structure comprising third capacitor 208 in series with first capacitor 204 and coupled between first capacitor 204 and the second terminal of voltage supply 202 and fourth capacitor 210 in series with second capacitor 206 and coupled between second capacitor 206 and the first terminal of voltage supply 202.

In operation, a differential signal $V_{CAP}$ comprising the difference in potential between a third electrode 110 and fourth electrode 112 may be generated due to the presence of AC bias voltage $V_{BIAS}$ and sound pressure incident on diaphragm 108 which induces changes in capacitances of first capacitor 204 and second capacitor 206. Thus, differential signal $V_{CAP}$ may comprise an audio signal which is a function of the sound pressure incident on diaphragm 108, wherein such audio signal is modulated at a frequency of AC bias voltage $V_{BIAS}$.

Amplifier 212 may comprise any suitable system, device, or apparatus configured to amplify an analog signal received at its input (e.g., differential signal $V_{CAP}$) to an amplified version of the input analog signal which may be more suitable for downstream processing.

Demodulator 214 may comprise any suitable system, device, or apparatus configured to extract from an analog signal (e.g., differential signal $V_{CAP}$ as amplified by amplifier 212) an information-bearing signal (e.g., analog microphone signal $V_{MIC}$) from a modulated carrier wave (e.g., a modulated carrier wave at the frequency of AC bias voltage $V_{BIAS}$). In some embodiments, demodulator 214 may comprise a synchronous modulator.

ADC 216 may comprise any suitable system, device, or apparatus configured to convert an analog signal (e.g., analog microphone signal $V_{MIC}$) into a corresponding digital signal (e.g., digital microphone signal MIC_DIG).

Direct-current voltage detector 218 may comprise any suitable system, device, or apparatus configured to receive digital microphone signal MIC_DIG and analyze such signal in order to detect a direct-current voltage offset present in differential signal $V_{CAP}$ of the bridge structure comprising capacitors 204, 206, 208, and 210. Based on the detected direct-current voltage offset present in differential signal $V_{CAP}$, direct-current voltage detector 218 may generate a direct-current compensation control signal DC_COMP to control at least one of the third capacitance of third capacitor 208 and the fourth capacitance of fourth capacitor 210 responsive to the direct-current voltage offset in order to compensate for the presence of the direct-current voltage offset.

Peak detector 220 may include any suitable system, device, or apparatus configured to receive analog microphone signal $V_{MIC}$ (or a derivative thereof), determine a magnitude of such signal, and output a peak amplitude signal PEAK indicative of such magnitude. Dynamic range enhancement controller 222 may include any suitable system, device, or apparatus configured to receive peak amplitude signal PEAK and based thereon, determine an analog gain for audio system 200 and generate an analog gain signal ANALOG_GAIN indicative of such analog gain. Analog gain signal ANALOG_GAIN may be used as a control signal in order to set a magnitude of AC bias voltage $V_{BIAS}$. Accordingly, the magnitude of AC bias voltage $V_{BIAS}$ may be set based on the magnitude of sound pressure upon diaphragm 108 in order to maximize a dynamic range of microelectromechanical systems microphone 100 and audio system 200. For example, to maximize dynamic range, dynamic range enhancement controller 222 may cause the magnitude of AC bias voltage $V_{BIAS}$ to increase as the sound pressure upon diaphragm 108 decreases, and cause the magnitude of AC bias voltage $V_{BIAS}$ to decrease as the sound pressure upon diaphragm 108 increases.

Capacitance measurement subsystem 224 may include any suitable system, device, or apparatus configured to measure a capacitance of first capacitor 204 (as explicitly shown in FIG. 2) and/or second capacitor 206 and output a gain compensation signal GAIN_COMP indicative of such measured capacitance. Such capacitance may be indicative of the sensitivity of measurement of audio system 200, and thus, as described below, may be used to compensate for such sensitivity.

Gain controller 226 may include any suitable system, device, or apparatus configured to receive analog gain signal ANALOG_GAIN and/or gain compensation signal GAIN_COMP and based thereon, generate a digital gain signal DIG_GAIN, which may be used by gain element 228 to control a digital gain applied to digital microphone signal MIC_DIG to generate an audio output signal AUDIO_OUT of audio system 200. Accordingly, digital gain signal DIG_GAIN may include two components. First, the level of digital gain indicated by digital gain signal DIG_GAIN may be based on an inverse of analog gain indicated by analog gain signal ANALOG_GAIN, in order to offset the analog gain applied in audio system 200 (e.g., to voltage supply 202) to maximize dynamic range. Second, the level of digital gain indicated by digital gain signal DIG_GAIN may also control a gain of audio system 200 responsive to the sensitivity of measurement, as may be indicated by the first capacitance of capacitor 204 and/or the second capacitance of capacitor 206.

Advantageously, the systems and methods herein may provide an improvement over existing MEMS microphone implementations. For example, replacing the direct-current (DC) biasing present in existing approaches with the AC biasing approach of the systems and methods disclosed herein creates a signal of interest modulated by a frequency of AC bias voltage $V_{BIAS}$, reducing or eliminating flicker noise and/or bias resistor noise that is typically present at low frequencies or at DC. In addition, because of the symmetric excitation applied to the capacitor bridge of audio system 200, the magnitude of AC bias voltage $V_{BIAS}$ may be modified without disturbing a bias point of the sensing amplifier (e.g., amplifier 212) of audio system 200. Accordingly, such magnitude of AC bias voltage $V_{BIAS}$ may be modified as a function of the magnitude of the acoustic pressure incident upon MEMS microphone 100, thus maximizing the dynamic range of MEMS microphone 100 and audio system 200. Furthermore, unlike DC-biased implementations, in which only the change in capacitance of MEMS microphone 100 can be measured but not the static capacitance, in the systems and methods described herein, such static capacitance can be measured, allowing for collection of additional information regarding audio system 200 (e.g., sensitivity), for which audio system 200 may make further adjustments to improve accuracy.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A microelectromechanical systems microphone, comprising:
   a backplate comprising a first plurality of electrodes comprising at least a first electrode and a second electrode electrically isolated from one another and each of the first plurality of electrodes is mechanically coupled to the backplate in a fixed relationship relative to the backplate; and
   a diaphragm configured to mechanically displace relative to the backplate as a function of sound pressure incident upon the diaphragm, wherein the diaphragm comprises a second plurality of electrodes, the second plurality of electrodes comprising at least a third electrode and a fourth electrode, wherein the third electrode and the fourth electrode are electrically isolated from one another and each of the second plurality of electrodes is mechanically coupled to the diaphragm in a fixed relationship relative to the diaphragm such that the second plurality of electrodes mechanically displace relative to the backplate as the function of sound pressure incident upon the diaphragm;
   wherein:
   the first electrode and the third electrode form a first capacitor having a first capacitance which is a function of a displacement of the diaphragm relative to the backplate;

the second electrode and the fourth electrode form a second capacitor having a second capacitance which is a function of the displacement of the diaphragm relative to the backplate; and each of the first capacitor and the second capacitor are biased by an alternating-current voltage waveform; wherein the first electrode is electrically coupled to a first terminal of a voltage supply providing the alternating-current voltage waveform and the second electrode is electrically coupled to a second terminal of the voltage supply.

2. The microelectromechanical systems microphone of claim 1, wherein the first capacitor and the second capacitor are electrically coupled to one another in a bridge structure, the bridge structure comprising:

a third capacitor in series with the first capacitor and coupled between the first capacitor and the second terminal of the voltage supply; and a fourth capacitor in series with the second capacitor and coupled between the second capacitor and the first terminal of the voltage supply.

3. The microelectromechanical systems microphone of claim 2, further comprising a direct-current voltage detector configured to detect a direct-current voltage offset present in the bridge structure.

4. The microelectromechanical systems microphone of claim 3, wherein the direct-current voltage detector is further configured to control at least one of a third capacitance of the third capacitor and a fourth capacitance of the fourth capacitor responsive to the direct-current voltage offset.

5. The microelectromechanical systems microphone of claim 1, wherein the alternating-current voltage waveform has a frequency greater than that of human hearing.

6. The microelectromechanical systems microphone of claim 1, wherein a magnitude of the alternating-current voltage waveform is set based on a magnitude of sound pressure upon the diaphragm in order to maximize a dynamic range of the microelectromechanical systems microphone.

7. The microelectromechanical systems microphone of claim 6, wherein the magnitude of the alternating-current voltage waveform increases as the sound pressure upon the diaphragm decreases and vice versa.

8. The microelectromechanical systems microphone of claim 1, further configured to measure at least one of the first capacitance and the second capacitance.

9. The microelectromechanical systems microphone of claim 8, further configured to control a gain of the microelectromechanical systems microphone responsive to the measurement of at least one of the first capacitance and the second capacitance.

10. A method, comprising:

biasing a first capacitor of an electromechanical systems microphone with an alternating-current voltage waveform;

biasing a second capacitor of the electromechanical systems microphone with the alternating-current voltage waveform; wherein:

the first capacitor is formed from a first electrode and a third electrode;

the second capacitor is formed from a second electrode and a fourth electrode;

the first electrode and the second electrode are electrically isolated from one another and each of the first electrode and the second electrode is mechanically coupled to a backplate in a fixed relationship relative to the backplate, the backplate comprising a first plurality of electrodes comprising the first electrode and the second electrode;

the third electrode and the fourth electrode are electrically isolated from one another and each of the third electrode and the fourth electrode is mechanically coupled to a diaphragm in a fixed relationship relative to the diaphragm such that a second plurality of electrodes, comprising the third electrode and the fourth electrode, mechanically displace relative to the backplate as a function of sound pressure incident upon the diaphragm which mechanically displaces the diaphragm relative to the backplate;

the first capacitor has a first capacitance which is a function of a displacement of the diaphragm relative to the backplate; and the second capacitor has a second capacitance which is a function of the displacement of the diaphragm relative to the backplate; and electrically coupling the first electrode to a first terminal of a voltage supply providing the alternating-current voltage waveform and electrically coupling the second electrode to a second terminal of the voltage supply.

11. The method of claim 10, wherein the first capacitor and the second capacitor are electrically coupled to one another in a bridge structure, the bridge structure comprising:

a third capacitor in series with the first capacitor and coupled between the first capacitor and the second terminal of the voltage supply; and a fourth capacitor in series with the second capacitor and coupled between the second capacitor and the first terminal of the voltage supply.

12. The method of claim 11, further comprising detecting a direct-current voltage offset present in the bridge structure.

13. The method of claim 12, further comprising controlling at least one of a third capacitance of the third capacitor and a fourth capacitance of the fourth capacitor responsive to the direct-current voltage offset.

14. The method of claim 10, wherein the alternating-current voltage waveform has a frequency greater than that of human hearing.

15. The method of claim 10, further comprising setting a magnitude of the alternating-current voltage waveform based on a magnitude of sound pressure upon the diaphragm in order to maximize a dynamic range of the microelectromechanical systems microphone.

16. The method of claim 15, further comprising increasing the magnitude of the alternating-current voltage waveform as the sound pressure upon the diaphragm decreases and vice versa.

17. The method of claim 10, further comprising measuring at least one of the first capacitance and the second capacitance.

18. The method of claim 17, further comprising controlling a gain of the microelectromechanical systems microphone responsive to the measurement of at least one of the first capacitance and the second capacitance.

* * * * *